US007644235B2

(12) United States Patent
Pawlowski

(10) Patent No.: US 7,644,235 B2
(45) Date of Patent: *Jan. 5, 2010

(54) DEVICE AND METHOD FOR CONFIGURING A CACHE TAG IN ACCORDANCE WITH BURST LENGTH

(75) Inventor: Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 434 days.

This patent is subject to a terminal disclaimer.

(21) Appl. No.: 11/499,108

(22) Filed: Aug. 3, 2006

(65) Prior Publication Data

US 2006/0271816 A1 Nov. 30, 2006

Related U.S. Application Data

(63) Continuation of application No. 11/142,969, filed on Jun. 2, 2005, now Pat. No. 7,089,375, which is a continuation of application No. 10/840,959, filed on May 7, 2004, now Pat. No. 6,925,579, which is a continuation of application No. 09/642,424, filed on Aug. 21, 2000, now Pat. No. 6,757,840.

(51) Int. Cl.
*G06F 13/00* (2006.01)

(52) U.S. Cl. .............................. 711/129; 714/7; 711/145

(58) Field of Classification Search .................. 711/129
See application file for complete search history.

(56) References Cited

U.S. PATENT DOCUMENTS

| 5,301,296 A | 4/1994 | Mohri et al. |
| 5,353,424 A | 10/1994 | Partovi et al. |
| 5,564,034 A | 10/1996 | Miyake |
| 5,729,497 A | 3/1998 | Pawlowski |
| 5,761,145 A * | 6/1998 | Zagar et al. ................. 365/226 |
| 5,905,996 A | 5/1999 | Pawlowski |
| 6,067,600 A | 5/2000 | Pawlowski |
| 6,185,149 B1 | 2/2001 | Fujioka et al. |
| 6,526,473 B1 | 2/2003 | Kim |
| 6,549,984 B1 | 4/2003 | Patterson et al. |

* cited by examiner

*Primary Examiner*—Reginald G Bragdon
*Assistant Examiner*—Larry T Mackall
(74) *Attorney, Agent, or Firm*—TraskBritt

(57) ABSTRACT

In a cache tag integrated on an SRAM with a memory cache, laser fuses are programmed to indicate which, if any, tag subarrays in the cache tag are not functioning properly. In addition, the burst length of the SRAM is increased to reduce the number of tag subarrays necessary for operation of the cache tag so any nonfunctional tag subarrays are no longer necessary. In accordance with the indications from the programmed laser fuses and the increased burst length, logic circuitry disables any nonfunctional tag subarrays, leaving only functional tag subarrays to provide tag functionality for the memory cache. As a result, an SRAM that is typically scrapped as a result of nonfunctional tag subarrays can, instead, be recovered for sale and subsequent use.

13 Claims, 5 Drawing Sheets

DEVICE AND METHOD FOR CONFIGURING A CACHE TAG IN ACCORDANCE WITH BURST LENGTH

CROSS-REFERENCE TO RELATED APPLICATIONS

This application is a continuation of application Ser. No. 11/142,969, filed Jun. 2, 2005, now U.S. Pat. No. 7,089,375, issued Aug. 8, 2006, which is a continuation of application Ser. No. 10/840,959, filed May 7, 2004, now U.S. Pat. No. 6,925,579, issued Aug. 2, 2005, which is a continuation of application Ser. No. 09/642,424, filed Aug. 21, 2000, now U.S. Pat. No. 6,757,840, issued Jun. 29, 2004, which is related to patent application Ser. No. 08/681,674 filed Jul. 29, 1996 entitled "Combined Cache Tag and Data Memory Architecture," now U.S. Pat. No. 5,905,996, and patent application Ser. No. 09/221,451, now U.S. Pat. No. 6,067,600, which is a continuation of U.S. Pat. No. 5,905,996, the disclosures of which are incorporated herein by reference.

BACKGROUND OF THE INVENTION

1. Technical Field

This invention relates in general to semiconductor memory devices and, more specifically, to a cache tag that can be configured in accordance with a selected burst length.

2. State of the Art

Modern memory systems for personal computers and the like generally include a main memory that consists of approximately 32 Megabytes (MB) or more of Synchronous Dynamic Random Access Memory (SDRAM), a smaller but faster memory cache that usually consists of about 512 Kilobytes (KB) of Static RAM (SRAM), and an even smaller cache "tag" that usually consists of about 16 KB to 64 KB of SRAM. The role of the memory cache is to provide, for some data requests, faster access to the requested data than the main memory can provide, and the role of the cache tag is to help determine whether or not the requested data is stored in the memory cache.

In one cache architecture, a microprocessor requests data from the memory system by first presenting the address of the requested data on a private cache bus interconnecting the microprocessor, the memory cache, and the cache tag. The cache tag receives the address (or, more commonly, a portion thereof), selects one of its internal memory locations in accordance with the address (or a portion thereof), and then writes out address data stored at the selected memory location to the microprocessor via the private cache bus. At the same time, the memory cache also receives the address, selects one of its internal memory locations in accordance with the address, and writes out the data stored at the selected memory location to the microprocessor.

If the microprocessor determines that the address data written out by the cache tag matches the address of the requested data (or a selected portion thereof), then a "cache hit" has occurred. In this circumstance, the microprocessor uses the data output by the memory cache, since the occurrence of a cache hit indicates that this data is the correct data. Conversely, if the microprocessor determines that the address data written out by the cache tag does not match the address of the requested data (or a selected portion thereof), then a "cache miss" has occurred. In this circumstance, the microprocessor requests the data from the main memory, because the occurrence of a cache miss indicates that the data output by the memory cache is not the correct data.

Defects sometimes occur in a cache tag during the manufacturing process that prevent certain memory locations within the tag from functioning properly. If these defects cannot be repaired through conventional use of redundant elements, then the integrated circuit (IC) device that incorporates the defective tag is typically scrapped. There is, therefore, a need in the art for a device and method that can recover such devices for sale and subsequent use, thereby avoiding the need to scrap the devices.

BRIEF SUMMARY OF THE INVENTION

A cache tag for use with a memory cache includes tag subarrays and status indicating elements (e.g., laser fuses, antifuses, flash memory cells, zero-ohm resistors) that indicate the functional status of the tag subarrays. Also, enabling circuitry selectively enables the tag subarrays in accordance with a selected burst length of the memory cache and the functional status of the tag subarrays as indicated by the status indicating elements. By increasing the burst length of the memory cache in order to reduce the number of tag subarrays needed for operation of the memory cache, and then disabling nonfunctional tag subarrays, a cache tag that typically would have been scrapped is, instead, recovered for sale and subsequent use.

In other embodiments of this invention, the cache tag described above is incorporated into an electronic system, a Static Random Access Memory (SRAM), a semiconductor memory device, and a semiconductor substrate (e.g., a semiconductor wafer).

In still another embodiment, a semiconductor memory device having a cache tag with nonfunctional tag subarrays is repaired by increasing the burst length of the memory device so the nonfunctional tag subarrays are not needed for operation of the memory device.

In yet another embodiment, the method described above is followed by selectively disabling the nonfunctional tag subarrays.

DETAILED DESCRIPTION OF THE INVENTION

In general, this invention provides, among other things, a device and method for recovering an IC device with a defective tag array by increasing the burst length of the device (e.g., from four (4) to eight (8)), which decreases the size (i.e., the depth) of the tag array required by the device, thereby allowing for the disablement of unneeded defective portions of the tag array.

Figure 1:
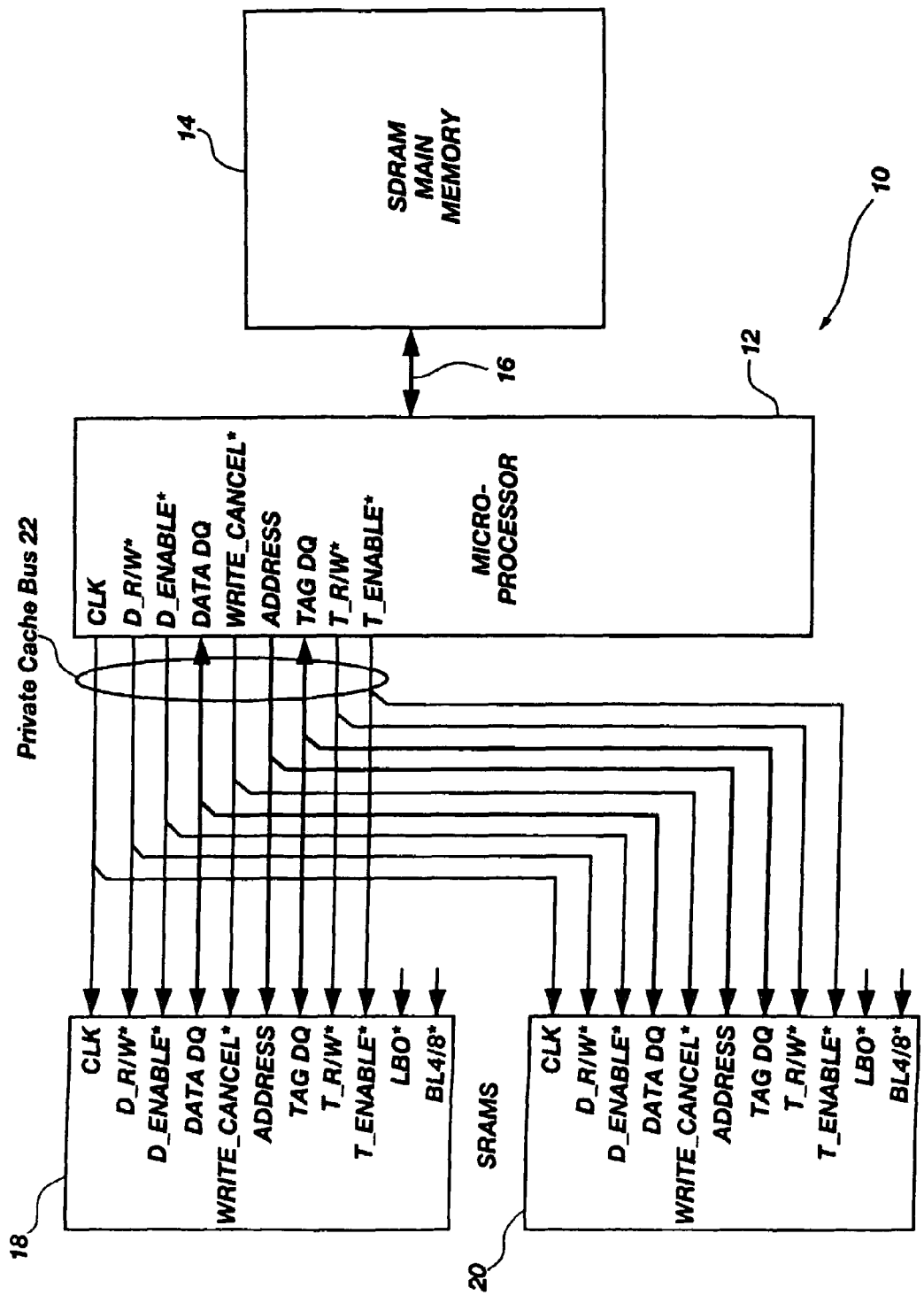
FIG. 1 is a block diagram of a computer system including a microprocessor, an SDRAM main memory, and a pair of SRAMs, each including an integrated memory cache and cache tag in accordance with this invention.

More specifically, as shown in FIG. 1, a computer system 10 in accordance with this invention includes a microprocessor 12 communicating with an SDRAM main memory 14 via address, data, and command busses 16, and with a pair of SRAMs 18 and 20 via a private cache bus 22.

It will be understood by those having skill in the technical field of this invention that the invention is applicable to a wide variety of cache architectures and is not limited to the architectures illustrated in FIGS. 1-4. For example, this invention may be used in a computer system in which the memory cache and cache tag share address and data busses with the main memory, rather than using a private cache bus. It will also be understood that this invention is not limited to systems including SDRAM or SRAM. Rather, the invention may be used in cooperation with any semiconductor memory device including, for example, a Synchronous Graphics RAM (SGRAM), a Dynamic Random Access Memory (DRAM), a Synch-Link DRAM (SLDRAM), and a RamBus-type DRAM.

Also, the SRAMs 18 and 20 shown in FIG. 1 each contain an integrated memory cache and cache tag, as described in more detail in the inventor's patent "Combined Cache Tag/Data Memory Architecture," referenced and incorporated herein in the Cross-Reference to Related Applications section above. It will be understood, though, that this invention is not limited to such SRAMs but, rather, is equally applicable to conventional cache architectures in which the memory cache and cache tag are provided in separate SRAMs or other devices.

Figure 2:
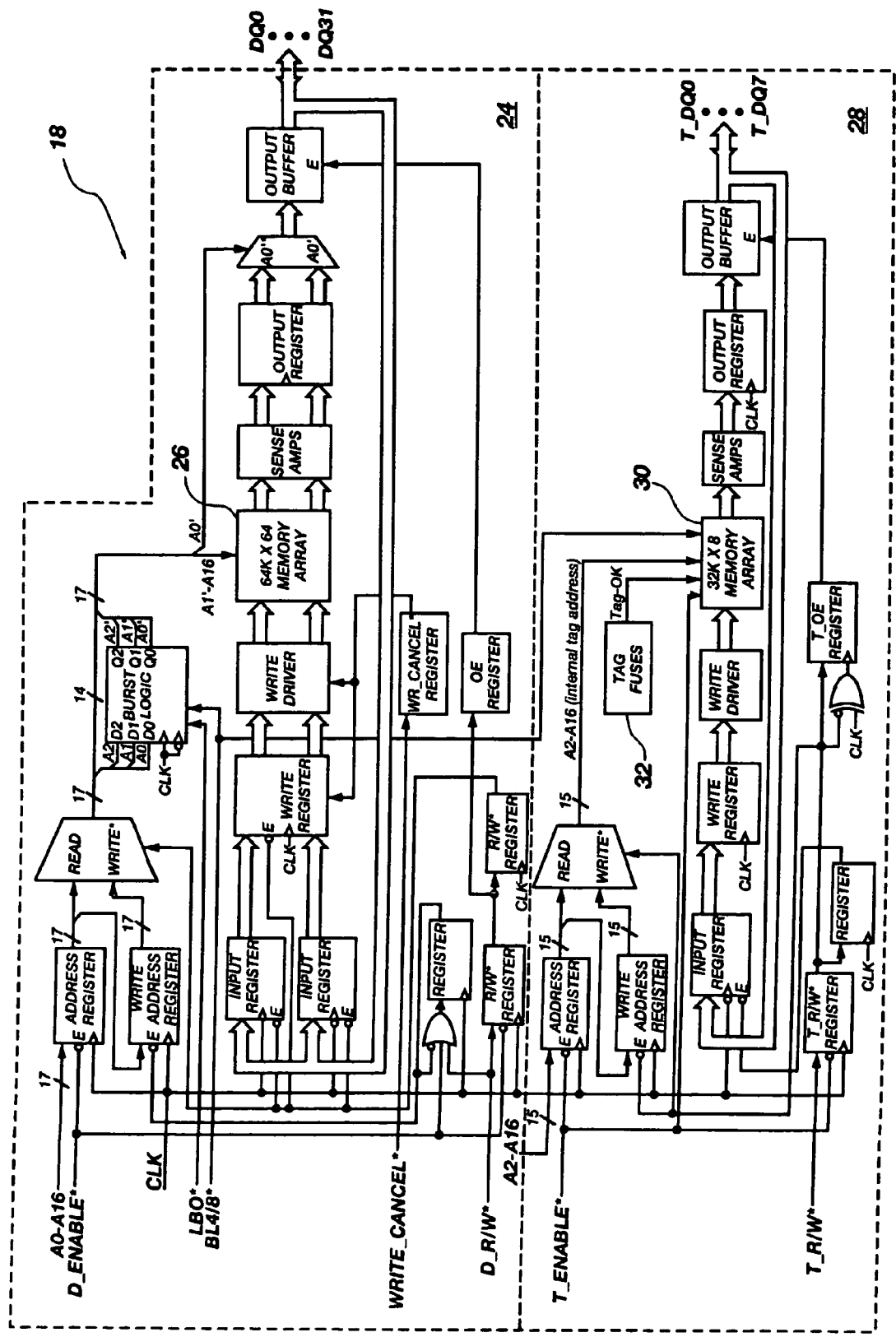
FIG. 2 is a block diagram illustrating one of the SRAMs of FIG. 1 in greater detail.

The SRAM 18 of FIG. 1 is shown in more detail in FIG. 2. It will be understood, of course, that the SRAM 20 is identical to the SRAM 18.

Referring to FIG. 2 and in general, a memory cache section 24 in the SRAM 18 provides data outputs DQ0-31 from a 64 KB×64 cache array 26 in response to address bits A0-A16, and a cache tag section 28 provides tag outputs T_DQ0-T_DQ7 from a 32 KB×8 tag array 30 in response to address bits A2-A16. Also, in accordance with the state of a burst length signal BL4/8*, the memory cache section 24 is set to output a burst of four (4) or eight (8) 64-bit words in response to each set of address bits A0-A16 received on the private cache bus 22 (FIG. 1). These bursts are set to occur in linear or interleaved order in accordance with the state of a linear burst order signal LBO*. Of course, it will be understood that this invention is not limited to a cache array or tag array of any particular width (e.g., sixty-four (64) in the case of the cache array 26) or depth (e.g., 32 KB in the case of the tag array 30).

The remainder of the general operations of the SRAM 18 will be apparent from the block diagram of FIG. 2 to those of skill in the technical field of this invention, and a detailed explanation of these operations is not necessary to an understanding of this invention. Therefore, these operations will not be described further herein.

The present invention provides, inter alia, tag fuses 32 in the SRAM 18 for indicating whether portions of the tag array 30 are functional or not, as will be described in more detail below with respect to FIG. 3. As shown in FIG. 2, the tag fuses 32 comprise laser fuses, but other status indicating elements may be substituted for the tag fuses 32, including, for example, antifuses, zero-ohm resistors, and flash memory cells.

Figure 3:
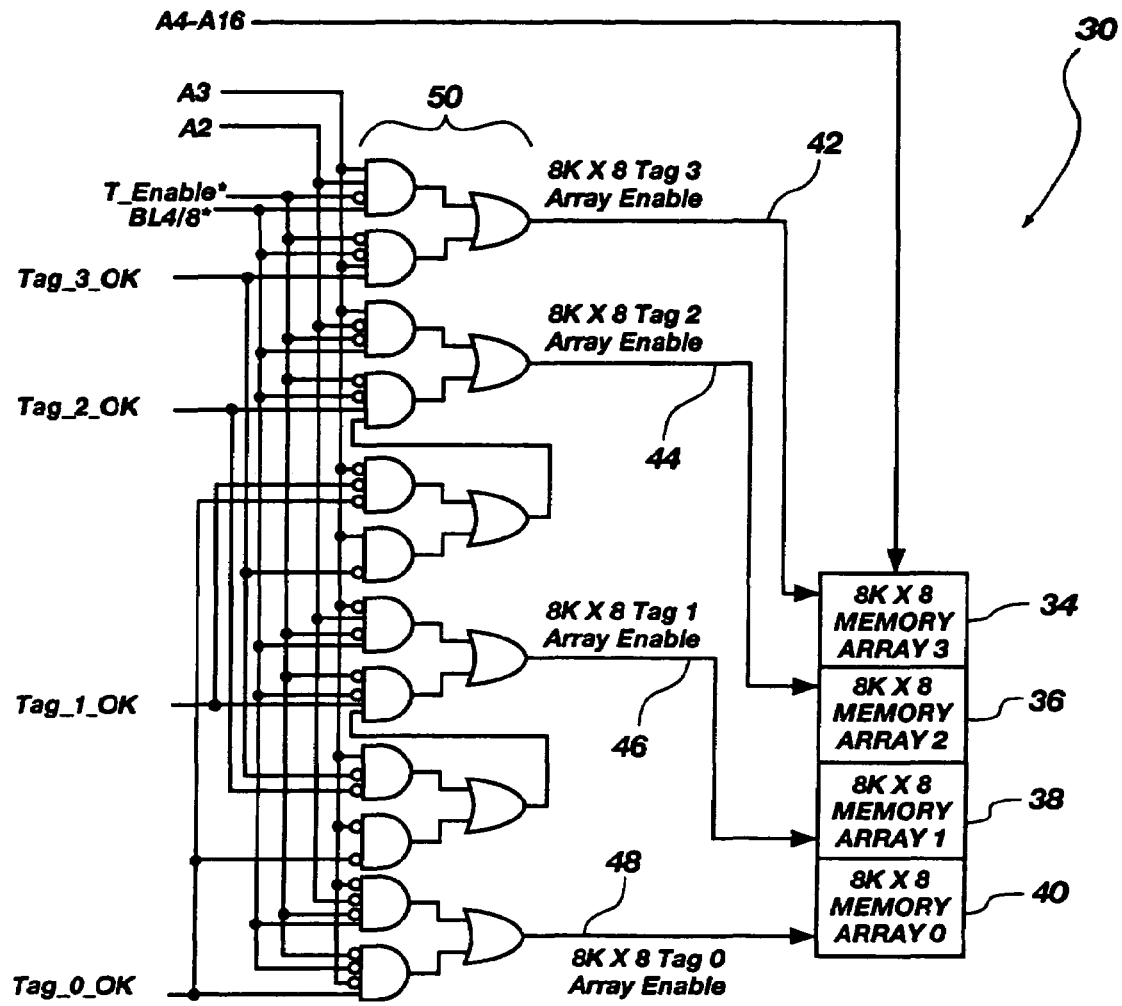
FIG. 3 is a block diagram illustrating one embodiment of a tag array of FIG. 2 in more detail.

As shown in FIG. 3, the tag array 30 includes a set of subarrays 34, 36, 38, and 40 that are enabled or disabled by enable signals 42, 44, 46, and 48, which are functions of address bits A2, A3, a tag enable signal T_Enable*, the burst length signal BL4/8*, and indication signals Tag_0-3_OK-Tag_3_OK from the tag fuses 32 (FIG. 2), and are produced by logic circuitry 50. The operation of the logic circuitry 50 is summarized in the following table (assuming that the tag enable signal T_Enable* is active):

TABLE 1

| Tag_0-3_OK | BL4/8* | A2 | A3 | Tag 0-3 Enable |
|---|---|---|---|---|
| φφφφ | 1 | 0 | 0 | 1φφφ |
| φφφφ | 1 | 1 | 0 | φ1φφ |
| φφφφ | 1 | 0 | 1 | φφ1φ |
| φφφφ | 1 | 1 | 1 | φφφ1 |
| 1φφφ | 0 | φ | 0 | 1φφφ |
| 01φφ | 0 | φ | 0 | φ1φφ |
| 001φ | 0 | φ | 0 | φφ1φ |
| φφφ1 | 0 | φ | 1 | φφφ1 |
| φφ10 | 0 | φ | 1 | φφ1φ |
| φ100 | 0 | φ | 1 | φ1φφ |

Thus, it can be seen from Table 1 that when the burst length is four (4) (i.e., the burst length signal BL4/8*=1), all four of the subarrays 34, 36, 38, and 40 are needed and are enabled (i.e., selected) based on the binary value of the address bits A2, A3. On the other hand, when the burst length is eight (8) (i.e., the signal BL4/8*=0), only two of the subarrays 34, 36, 38, and 40 are needed. Accordingly, when the address bit A3 is low, the first of the subarrays 40, 38, and 36 that is functional is enabled (i.e., selected), and when the address bit A3 is high, the first of the subarrays 34, 36, and 38 that is functional is enabled (i.e., selected). In either case, data from the enabled subarray 34, 36, 38, or 40 is selected and output in accordance with the address bits A4-A16.

Accordingly, when the SRAM 18, for example, is rendered nonfunctional as a result of one of the subarrays 34, 36, 38, and 40 being nonfunctional, the SRAM 18 can be recovered in accordance with this invention (rather than being scrapped) by converting it to a burst length of eight (8) device and disabling those of the subarrays 34, 36, 38, and 40 that contain nonfunctioning elements, as long as no more than two of the subarrays 34, 36, 38, and 40 are nonfunctional (recall, of course, that those of the subarrays 34, 36, 38, and 40 that can be repaired by conventional redundancy techniques are considered functional).

It will be understood, of course, that other schemes which divide the tag array 30 into more or fewer subarrays than shown in FIG. 3 are also included within the scope of this invention.

Figure 4:
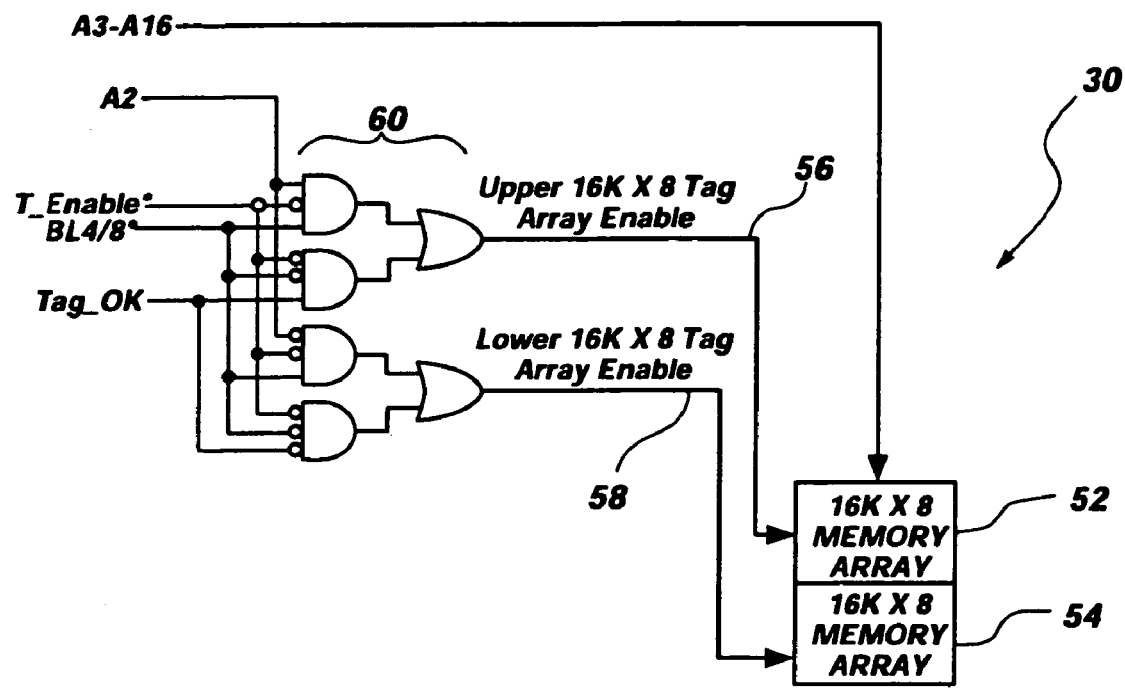
FIG. 4 is a block diagram illustrating an alternative embodiment of the tag array of FIG. 2 in more detail.

For example, as shown in FIG. 4 in an alternative embodiment, the tag array 30 includes a set of subarrays 52 and 54 that are enabled or disabled by enable signals 56 and 58, which are functions of address bit A2, the tag enable signal T_Enable*, the burst length signal BL4/8*, and indication signal Tag_OK from the tag fuses 32 (FIG. 2), and are produced by logic circuitry 60. The operation of the logic circuitry 60 is summarized in the following table (assuming that the tag enable signal T_Enable* is active):

TABLE 2

| Tag_OK | BL4/8* | A2 | Upper/Lower Tag Enable |
|---|---|---|---|
| φ | 1 | 1 | 1/φ |
| φ | 1 | 0 | φ/1 |
| 1 | 0 | φ | 1/φ |
| 0 | 0 | φ | φ/1 |

Thus, it can be seen from Table 2 that when the burst length is four (4) (i.e., the burst length signal BL4/8*=1), all of the subarrays 52 and 54 are needed and are enabled (i.e., selected) based on the binary value of the address bit A2. On the other hand, when the burst length is eight (8) (i.e., the signal BL4/8*=0), only one of the subarrays 52 and 54 is needed. Accordingly, when the subarray 52 is functional, it is enabled, and when the subarray 52 is nonfunctional but the subarray 54 is functional, the subarray 54 is enabled. In either case, data from the enabled subarray 52 or 54 is selected and output in accordance with the address bits A3-A16.

Accordingly, when the SRAM 18, for example, is rendered nonfunctional as a result of one of the subarrays 52 and 54 being nonfunctional, the SRAM 18 can be recovered (rather than being scrapped) by converting it to a burst length of eight (8) device and disabling the one of the subarrays 52 and 54 that contains nonfunctioning elements, as long as no more than one of the subarrays 52 and 54 is nonfunctional (recall, of course, that those of the subarrays 52 and 54 that can be repaired by conventional redundancy techniques are considered functional).

Figure 5:
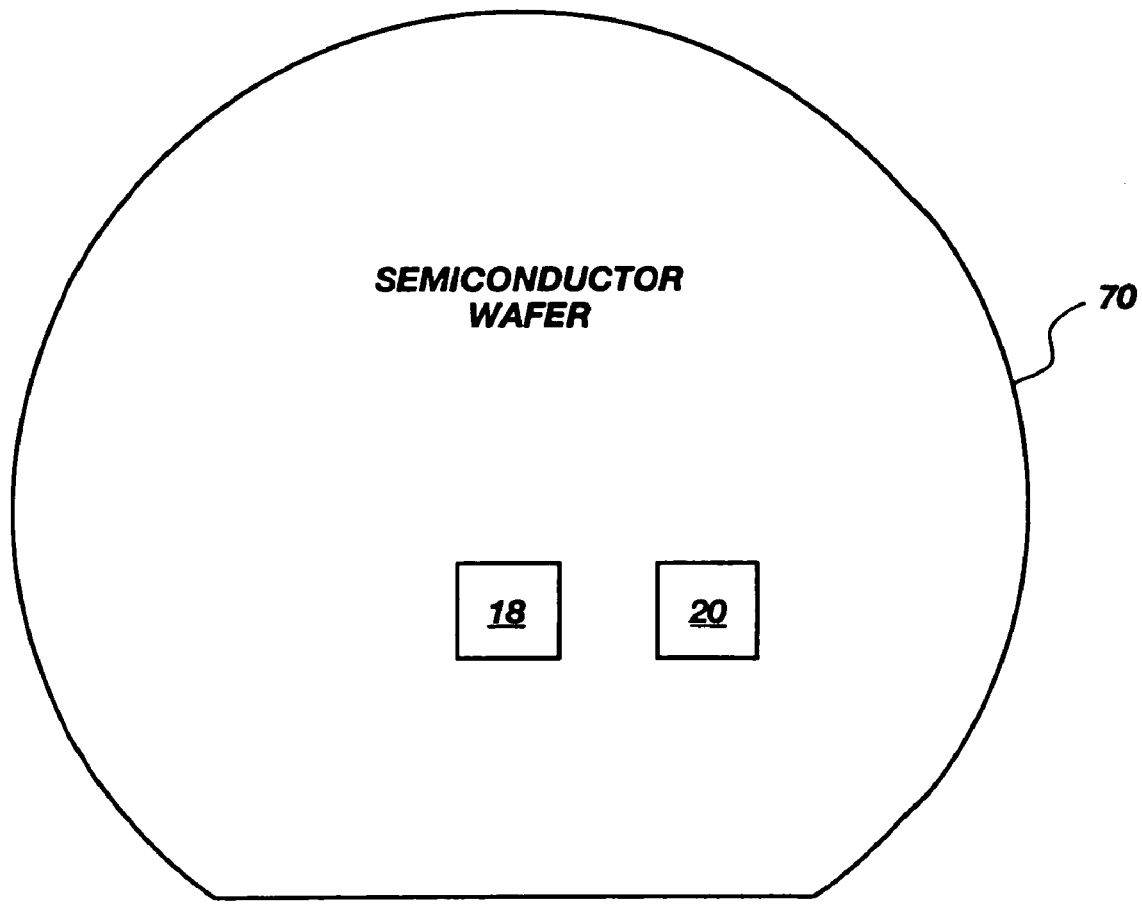
FIG. 5 is a diagram illustrating a semiconductor wafer on which the SRAMs of FIG. 1 are fabricated.

As shown in FIG. 5, the SRAMs 18 and 20 of FIG. 1 are fabricated on the surface of a semiconductor wafer 70 in accordance with this invention. Of course, it should be understood that the SRAMs 18 and 20 may be fabricated on semiconductor substrates other than a wafer, such as a Silicon-on-Insulator (SOI) substrate, a Silicon-on-Glass (SOG) substrate, and a Silicon-on-Sapphire (SOS) substrate.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method for modifying a cache tag memory, the method comprising:
    determining a functional status of each of a plurality of tag subarrays within the cache tag memory; and
    dividing the plurality of tag subarrays into enabled tag subarrays and disabled tag subarrays in response to finding at least one nonfunctional tag subarray of the plurality of tag subarrays and a selected burst length.

2. The method according to claim 1, wherein dividing the plurality of tag subarrays further comprises modulating the selected burst length of the cache tag memory.

3. A method for modifying a memory device, the method comprising:
    evaluating a functional status of each of a plurality of subarrays within the memory device; and
    reducing a number of the plurality of subarrays required for operation of the memory device in response to the functional status of each of the plurality of subarrays and a selected burst length.

4. A method for repairing a device operable for determining whether data is present in a memory cache, the method comprising:
    disabling at least one nonfunctional array of a plurality of arrays within the device in accordance with a selected burst length of the device and a functional status of the plurality of arrays.

5. A method for modifying a behavior of a cache tag memory, the method comprising:
    increasing a number of enabled tag subarrays of a plurality of tag subarrays within the cache tag memory in accordance with a selected burst length of the cache tag memory and a functional status of the plurality of tag subarrays.

6. A method for modifying a behavior of a cache tag memory, the method comprising:
    enabling a plurality of memory locations within the cache tag memory in accordance with a selected burst length of the cache tag memory and a functional status of the plurality of memory locations.

7. A method for modifying a behavior of a cache tag memory, the method comprising:
    disabling at least one nonfunctional tag subarray of a plurality of tag subarrays within the cache tag memory in accordance with a selected burst length of the cache tag memory and a functional status of the plurality of tag subarrays.

8. The method of claim 7, wherein disabling at least one nonfunctional tag subarray is further in accordance with a logic state of at least one address signal.

9. A method for modifying a behavior of a cache tag memory, the method comprising:
    modifying a state of a selected burst length of the cache tag memory; and
    disabling at least one nonfunctional tag subarray of a plurality of tag subarrays in the cache tag memory in accordance with the state of the selected burst length and a functional status of the plurality of tag subarrays.

10. The method of claim 9, wherein disabling at least one nonfunctional tag subarray is further in accordance with a logic state of at least one address signal.

11. The method of claim 9, wherein modifying the state of the selected burst length comprises doubling the state of the selected burst length.

12. A cache tag memory, comprising:
    a plurality of tag subarrays; and
    enabling circuitry coupled to the plurality of tag subarrays configured for selectively enabling the plurality of tag subarrays in accordance with a functional status of the plurality of tag subarrays and a selected burst length.

13. A semiconductor memory device, comprising:
    a plurality of subarrays; and
    enabling circuitry coupled to the plurality of subarrays configured for selectively increasing the plurality of subarrays in accordance with a selected burst length of the semiconductor memory device and a functional status of the plurality of subarrays.

* * * * *

UNITED STATES PATENT AND TRADEMARK OFFICE
CERTIFICATE OF CORRECTION

PATENT NO. : 7,644,235 B2
APPLICATION NO. : 11/499108
DATED : January 5, 2010
INVENTOR(S) : Joseph T. Pawlowski It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 589 days.

Signed and Sealed this

Twenty-first Day of December, 2010

David J. Kappos
*Director of the United States Patent and Trademark Office*